United States Patent [19]
Ujihara

[11] Patent Number: 5,814,935
[45] Date of Patent: Sep. 29, 1998

[54] ORGANIC ELECTROLUMINESCENCE DEVICE

[75] Inventor: Takashi Ujihara, Yamagata-ken, Japan

[73] Assignees: Pioneer Electronic Corp., Tokyo; Tohoku Pioneer Electronic Corp., Yamagata-ken, both of Japan

[21] Appl. No.: 795,774

[22] Filed: Feb. 5, 1997

[30] Foreign Application Priority Data

Feb. 7, 1996 [JP] Japan .................................. 8-045492

[51] Int. Cl.$^6$ .............................. H01J 1/62; H01J 63/04

[52] U.S. Cl. ........................................................... 313/504

[58] Field of Search .................................... 313/355, 503, 313/504, 631, 633; 257/40, 81, 82, 88, 431, 432

[56] References Cited

U.S. PATENT DOCUMENTS 5,703,394  12/1997  Wei et al. ............................ 257/433
5,731,661  3/1998  So et al. .............................. 313/504

*Primary Examiner*—William L. Oen
*Attorney, Agent, or Firm*—Nikaido, Marmelstein, Murray & Oram LLP

[57] ABSTRACT

A first substrate has anodes and cathodes, and an organic luminous material layer is formed between the anodes and cathodes. A second substrate has first conductive patterns formed on one of sides thereof, and second conductive patterns formed on the other side. The second conductive patterns are electrically connected to the first conductive patterns by throughholes formed in the second substrate, and the first conductive patterns are electrically connected to cathodes. Other second conductive patterns are electrically connected to the anodes. The space between the first and second substrates is hermetically sealed at peripheral portions thereof.

5 Claims, 5 Drawing Sheets

ORGANIC ELECTROLUMINESCENCE DEVICE

BACKGROUND OF THE INVENTION

The present invention relates to an organic electroluminescence element or device preferably employed as a display or a light emitting element of various types of instruments in the information industry, and more particularly to a connecting wiring structure of electrodes in the organic electroluminescence device.

As an electroluminescence device employed for a display unit and a pixel of various types of instruments, an organic electroluminescence device (hereinafter called organic EL device) is known.

FIGS. 4a and 4b show a conventional organic EL device. The organic EL device comprises a transparent glass substrate 101, and a plurality of transparent strips of anodes 102 formed on the glass substrate 101 into parallel lines. On the anodes 102, a luminous function layer 103 comprising an organic fluorescent thin film and an organic hole transporting layer is coated, exposing opposite end portions of the anodes. Furthermore, a plurality of strips of cathodes 104 made of metal are formed on the luminous function layer 103 into parallel lines. The cathodes 104 are formed on the layer 103 by vacuum evaporation, disposed perpendicular to the anodes 102. Opposite end portions of each cathode 104 are bent and secured to the glass substrate 101.

One of the end portions of each anode 102 is connected to a conductive wire 102a. The wire 102a is connected to an anode driving IC 105 for driving the anode. Similarly, an end portion of each cathode 104 is connected to a conductive wire 104a, and the wire 104a is connected to a cathode driving IC 106 for driving the cathode. The anode driving IC 105 and the cathode driving IC 106 are connected through wires 105a and 106a, respectively, to an external signal electrode 107 which is provided on a predetermined area of the glass substrate 101. Thus, a drive signal input terminal of the organic EL device is formed.

In operation, based on a drive signal applied to the external signal electrode 107, the anode and cathode driving ICs 105 and 106 are driven for driving desired lines of the anodes 102 and cathodes 104. A cross point of the desired anode 102 and cathode 104 applies a current to the luminous function layer 103 corresponding to the cross point, so that the layer 103 emits the light at the cross point.

In the organic EL device, the luminous function layer 103 is deteriorated by moisture. Therefore, a sealing can 108 made of metal is mounted on the glass substrate 101 to cover the anodes 102, luminous function layer 103 and cathodes 104, for maintaining the function of the layer 103. The lower portion of the sealing can 108 is adhered to the glass substrate 101 by an adhesive 109 so as to hermetically seal the layered elements therein. Thus, the moisture in the atmosphere is prevented from entering the sealing can 108.

However, when the organic EL device is used for a long time, a gap may be produced at the connecting portion between the adhesive 109 and the glass substrate 101 or between the adhesive 109 and the sealing can 108, or the moisture may permeate the adhesive 109. As a result, the luminous function layer 103 is exposed to the moisture. It is difficult to elongate the life of the conventional device. In order to elongate the life, it is necessary to increase the adhesion area between the glass substrate 101 and the sealing can 108. However, the increase of the area causes the size of the glass substrate 101 to be increased. Therefore, it is difficult to miniaturize the organic EL device.

Furthermore, in order to increase the space efficiency of the device, each of the anode 102 and the cathode 104 is connected to the corresponding driving IC at one of the end portion thereof. However, since each of the anode and cathode is formed in fine strip, the electrode has a large electric resistances. Therefore, there is a difference of luminous efficacy between the cross point near the driving IC and the cross point away from the driving IC on the same line of the cathode 104. As a result, the conventional device has a drawback that the luminance is uneven.

SUMMARY OF THE INVENTION

An object of the present invention is to provide an organic EL device which has a small size and for stably emits the light for a long time.

Another object of the present invention is to provide an organic EL device which has an even luminance.

According to the present invention, there is provided an organic electroluminescence device comprising a first substrate, at least one anode and at least one cathode formed on the first substrate as electrodes, an organic luminous material layer formed between the anode and cathode, a second substrate having at least two throughholes, at least one first conductive pattern formed on one of sides of the second substrate, at least two second conductive patterns formed on the other side of the second substrate, one of the second conductive patterns being electrically connected to the first conductive pattern through one of the throughholes, the first conductive pattern being electrically connected to one of the anode and cathode, the other second conductive pattern being electrically connected to the other electrode of anode or cathode, sealing means for joining the first and second substrates at the electrode side and the first pattern side and for hermetically sealing a space between the first and second substrates at peripheral portions thereof.

The sealing means comprises metallic junction portions formed on the peripheral portions on the first and second substrates, and joining the junction portions by soldering.

Driving circuits are mounted on the second conductive pattern side of the second substrate for driving the organic electroluminescence device.

In an aspect of the invention, the cathode comprises a plurality of line electrodes, and the first conductive pattern comprises a plurality of line patterns corresponding to the line electrodes, and each pattern is electrically connected to the corresponding line electrode at both ends thereof.

These and other objects and features of the present invention will become more apparent from the following detailed description with reference to the accompanying drawings.

DETAILED DESCRIPTION OF THE PREFERRED EMBODIMENT

Figure 1:
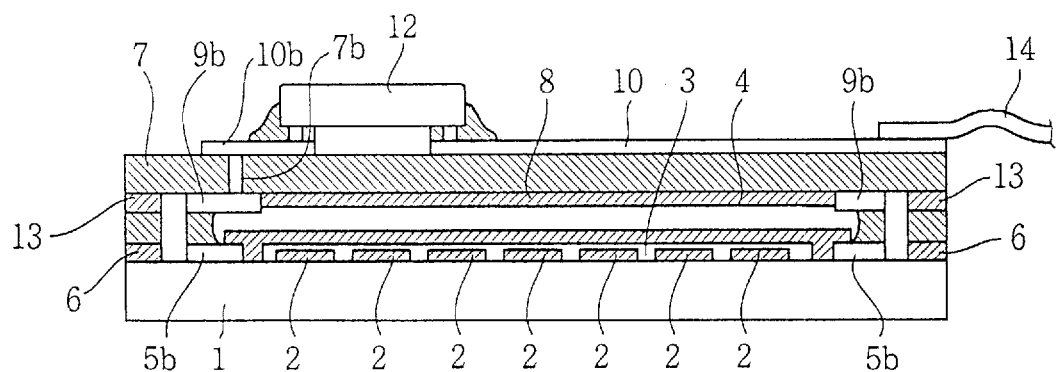
FIG. 1a is a sectional view showing an organic electroluminescence (EL) device according to the present invention taken along a line corresponding to a cathode.
FIG. 1b is a sectional view of the organic EL device taken along a line corresponding to an anode.
Figure 1:
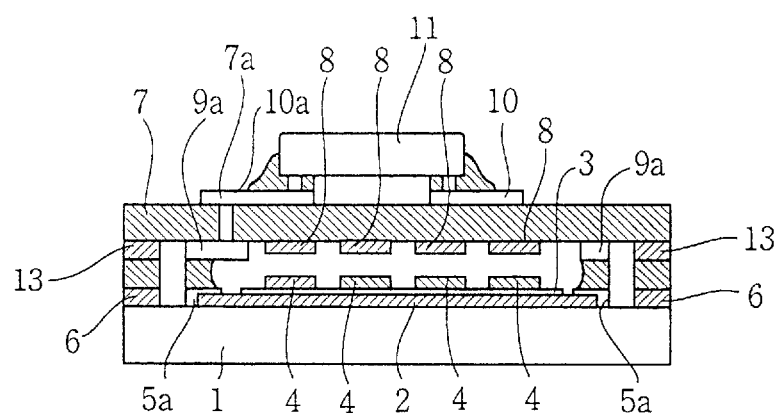

Referring to FIGS. 1a and 1b, an organic EL device of the present invention comprises a transparent glass substrate 1 and a double-sided substrate 7 made of ceramics and provided corresponding to the glass substrate 1.

Figure 2:
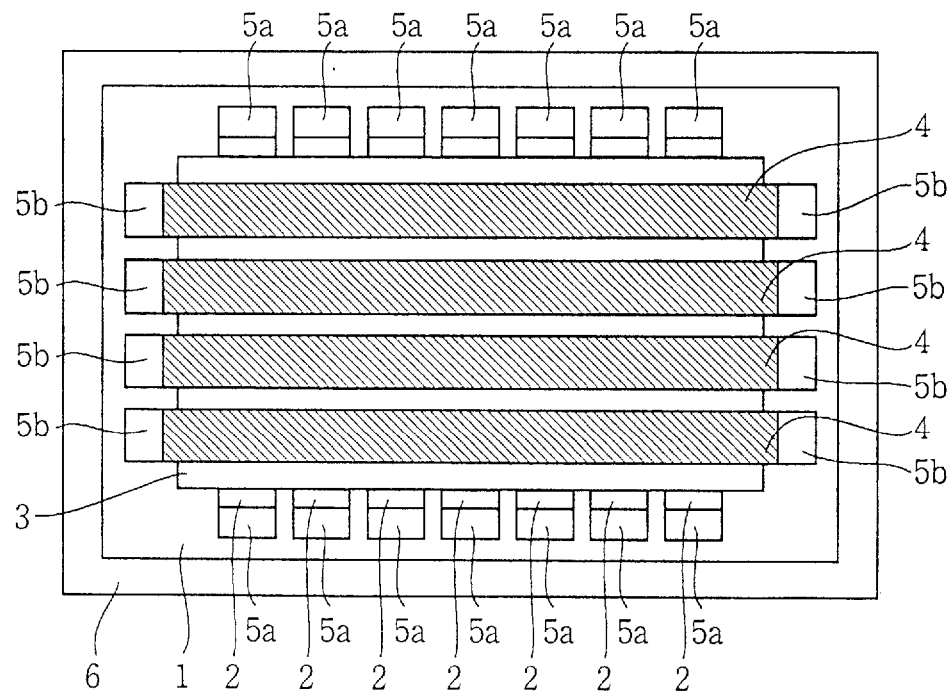
FIG. 2a is a plan view showing an assembled unit of a glass substrate of the device.
FIG. 2b is a sectional view of the glass substrate unit taken along a line corresponding to the cathode.
Figure 2:
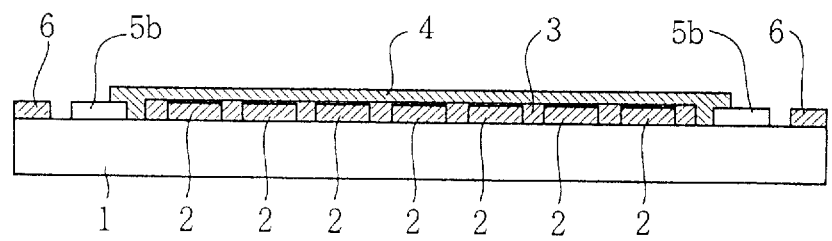

Referring to FIGS. 2a and 2b showing a glass substrate unit, a plurality of transparent strips of anodes 2 are formed on the transparent glass substrate 1 by vacuum evaporation at a predetermined thickness, disposed to be parallel with each other. Each anode 2 is formed by a material such as Indium-Tin-Oxide (ITO). Both end portions of the anode 2 are connected to junction portions 5a made of metal so as to provide an electric connection. The junction portions 5a are secured to the glass substrate 1 as shown in FIG. 1b.

A luminous function layer 3 comprising organic fluorescent thin film and organic hole transporting layer is formed on the glass substrate 1 so as to coat the anodes 2, exposing the end portions thereof.

A plurality of strips of cathodes 4 made of metal are formed on the luminous function layer 3 into parallel lines. The cathodes 4 are formed by vacuum evaporation, disposed perpendicular to the anodes 2. Both end portions of the cathode 4 are secured to the glass substrate 1, and electrically connected to junction portions 5b made of metal which are secured to the glass substrate 1.

Each of the junction portions 5a and 5b may be made of a conductive material such as metal formed on the glass substrate 1 by vacuum evaporation or by applying the metal to the glass substrate at a predetermined thickness, or formed by a part of the anode 2 or the cathode 4 itself.

A peripheral junction portion 6 made of metal is provided on the periphery of the glass substrate 1 to form an annular wall having a predetermined height as a part of a package of the device for surrounding the layered elements. The peripheral junction portion 6 is formed on the glass substrate 1 by vacuum evaporation, plating, deposition or electrodeposition of metallic material at a predetermined thickness.

Figure 3:
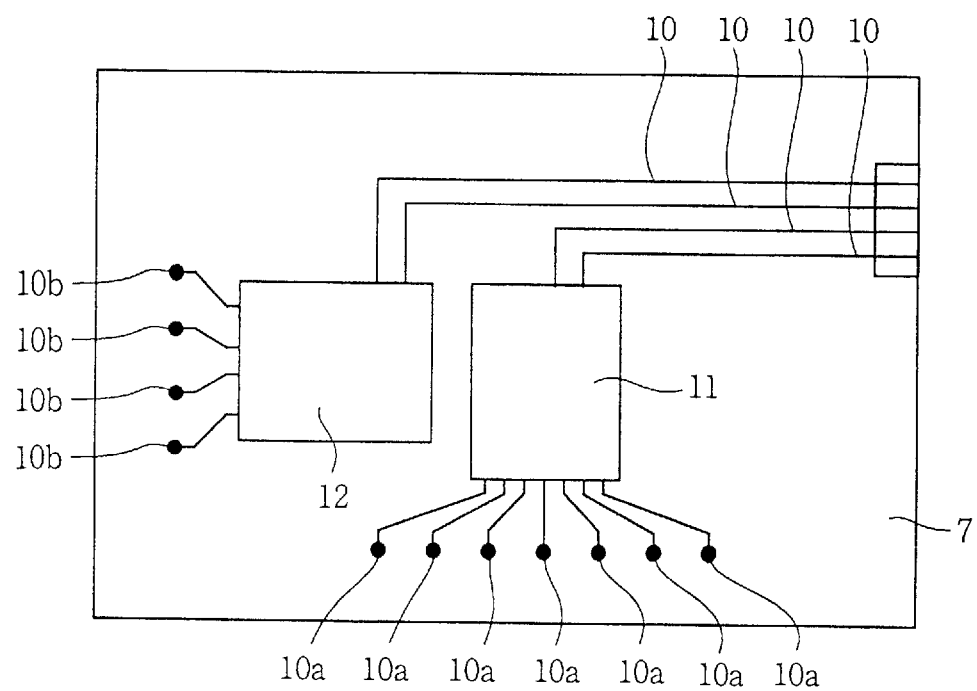
FIG. 3a is a plan view showing an assembled unit of a double-sided substrate of the device viewed from an upper portion.
FIG. 3b is a sectional view of the double-sided substrate unit taken along a line corresponding to a conductive pattern.
FIG. 3c is a plan view of the double-sided substrate unit viewed from a lower portion.
Figure 3:
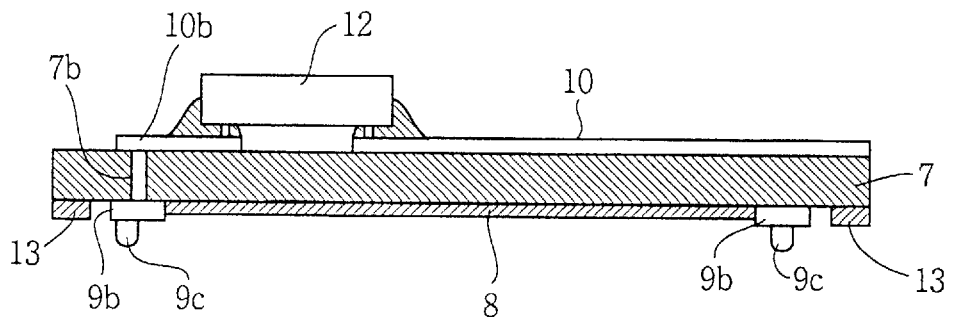
Figure 3:
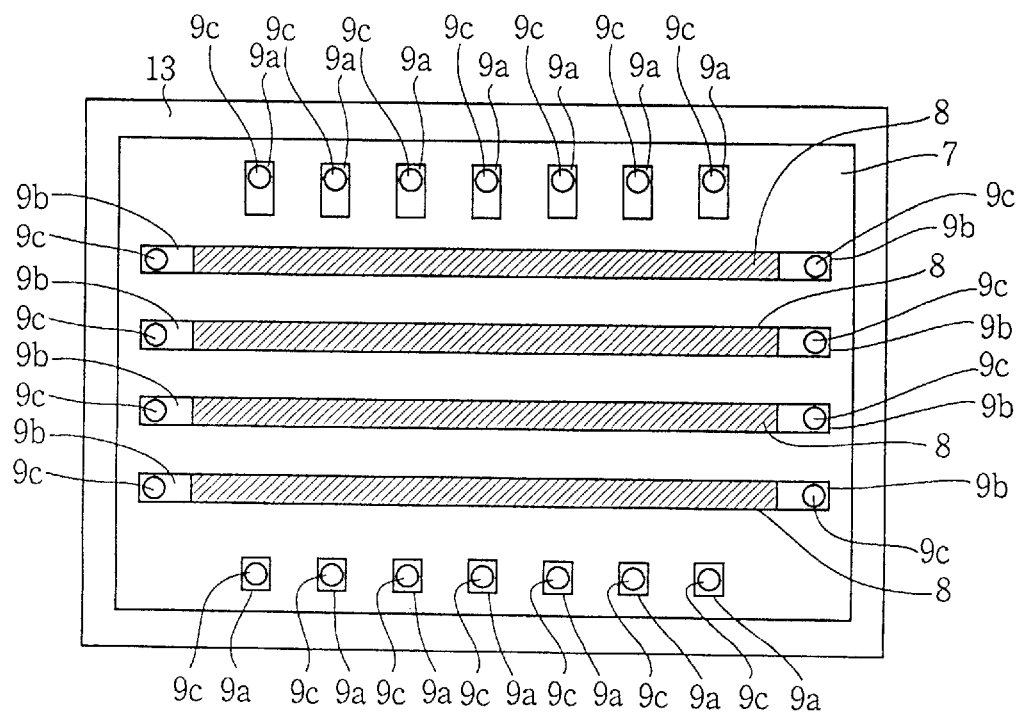
Figure 4:
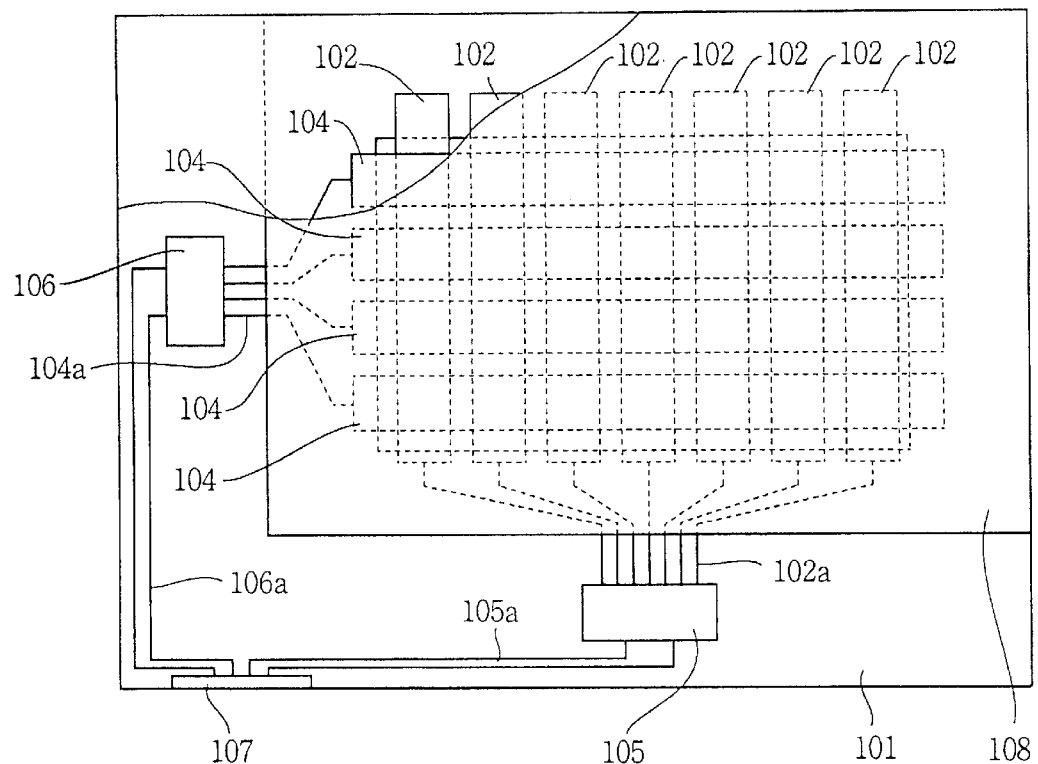
FIG. 4a is a plan view showing a conventional organic EL device.
FIG. 4b is a sectional view of the conventional organic EL device.
Figure 4:
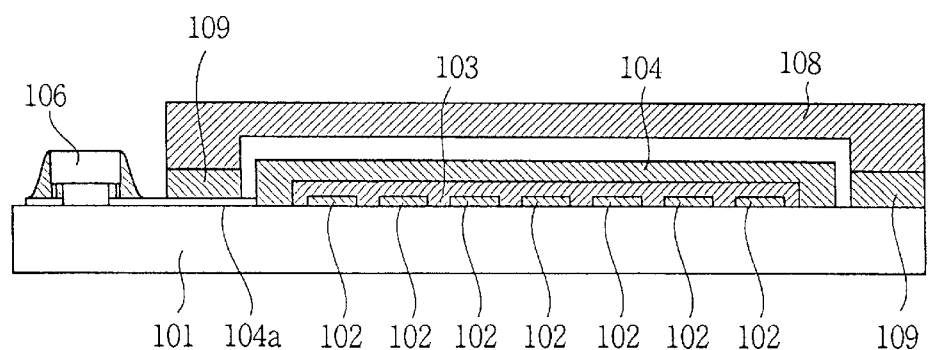

Referring to FIGS. 3a to 3c showing a double-sided substrate unit, on the double-side substrate 7, a peripheral junction portion 13 made of metal is formed at the periphery thereof, corresponding to the peripheral junction portion 6 of the glass substrate 1. A plurality of strips of conductive patterns 8 are formed on the substrate 7 at the positions corresponding to the cathodes 4 of the glass substrate 1. The conductive patterns 8 are formed by a copper foils to be parallel with each other corresponding to the cathodes 4. Both end portions of each conductive pattern 8 are electrically connected to junction portions 9b made of metal which are secured to the substrate 7.

The conductive pattern 8 is made of aluminum, silver or gold other than the copper. The shape of the pattern 8 may be selected other than the foil, such as a plate or bar formed into a strip or uncertain shape.

As shown in FIG. 3c, the substrate 7 further has a plurality of junction portions 9a made of metal formed corresponding to the junction portions 5a of the anodes 2 on the glass substrate 1.

As shown in FIG. 3a, on the other side of the substrate 7, there are provided a plurality of conductive patterns 10, wires 10a and 10b, and an anode driving IC 11 and a cathode driving IC 12. The conductive patterns 10 are connected to the anode and cathode driving ICs 11 and 12. The wires 10a are connected to the anode driving IC 11. The wires 10b are connected to the cathode driving IC 12. Thus, a driving circuit of the device is formed. The conductive patterns 10 are further connected to a flexible printed substrate 14 (FIG. 1a). Thus, a drive signal input terminal is formed.

The substrate further 7 has throughholes 7a and 7b (FIGS. 1a and 1b) for connecting the junction portions 9a and 9b to the wires 10a and 10b. The junction portions 9a and 9b are directly connected to the wires 10a and 10b by the throughholes or by short-circuit pins in the throughholes.

Each of the cathodes 4 is connected to the corresponding conductive pattern 8 in parallel through the junction portions 5b and 9b.

In order to electrically connect the anodes and cathodes of the glass substrate to the drive circuit of the double-sided substrate, the junction portions 5a and 9a, and the junction portions 5b and 9b are secured to each other by soldering, which will be described hereinafter in detail. In order to form the package of the device, the peripheral junction portions 6 and 13 are secured to each other by soldering, which will be described hereinafter.

An assembling method of the organic EL device will be described. As shown in FIGS. 2a and 2b, the anodes 2, luminous function layer 3, cathodes 4, junction portions 5a and 5b, and peripheral junction portion 6 are formed on the glass substrate 1. On the double-sided substrate 7 having throughholes, conductive patterns 8, conductive patterns 10, anode leading wires 10a, cathode leading wires 10b, junction portions 9a and 9b, and peripheral junction portion 13 are formed as shown in FIGS. 3a to 3c.

The junction portions 9a and 9b are connected to the corresponding wires 10a and 10b, and the throughholes are closed by soldering. A solder bump 9c is provided on each of the junction portions 9a and 9b at a predetermined height.

The junction portions 5a and 5b of the glass substrate 1 are positioned to the solder bumps 9c on the junction portions 9a and 9b of the double-sided substrate 7, and both of the substrates are supported by jigs and disposed at a predetermined distance.

The supported substrates 1 and 7 are heated in the inert gas atmosphere such as nitrogen in a thermostat. Thus, the solder bumps 9c are melted to solder the corresponding junction portions 5a and 9a, and the junction portions 5b and 9b, respectively, so as to electrically connect the anodes and the cathodes to the wires 10a, 10b.

Then, cream solder or solder ball is applied to each of the peripheral junction portions 6 and 13 of the supported substrates 1 and 7, and the substrates are heated in the inert gas atmosphere such as nitrogen in the thermostat. Thus, the peripheral junction portions 6 and 13 are soldered to each other without a gap there-between. Thus, the layer elements of anodes 2, luminous function layer 3, cathodes 4, and the conductive patterns 8 are sealed between the substrates. The layered elements are hermetically sealed, and the inside of the package is filled with the inert gas. Consequently, the luminous function layer 3 is ensurely separated from the moisture in the atmosphere.

In the embodiment, although the double-sided substrate is formed by ceramics, other materials having a water-proof characteristic for a long time such as glass can be employed.

The solder bump may be provided on the junction portions 5a and 5b, or either one of the junction projections 9a and 5a, or the junction portions 9b and 5b, which may be properly selected.

In accordance with the present invention, the glass substrate and the double-sided substrate are secured each other at the peripheral portions thereof and hermetically sealed by soldering. Thus, the layered elements between the substrates are ensurely separated from the moisture in the atmosphere, whereby the life of the device can be elongated.

The drive circuit is formed on the outer side of the double-sided substrate. Therefore, it is not necessary to provide a space for the drive circuit by increasing the size of the glass substrate. Consequently, the organic EL device can be miniaturized.

The cathodes are connected to the conductive patterns. Consequently, the line resistance of the cathode is reduced so that the electric resistances at the cross points of the anodes and cathode are approximately equalized. Consequently, the luminance of the device is regularized.

While the invention has been described in conjunction with preferred specific embodiment thereof, it will be understood that this description is intended to illustrate and not limit the scope of the invention, which is defined by the following claims.

What is claimed is:

1. An organic electroluminescence device comprising:

a first substrate;

at least one anode and at least one cathode formed on the first substrate as electrodes;

an organic luminous material layer formed between the anode and cathode;

a second substrate having at least two throughholes;

at least one first conductive pattern formed on one of sides of the second substrate;

at least two second conductive patterns formed on the other side of the second substrate;

one of the second conductive patterns being electrically connected to the first conductive pattern through one of the throughholes;

the first conductive pattern being electrically connected to one of the anode and cathode;

the other second conductive pattern being electrically connected to the other electrode of anode or cathode;

sealing means for joining the first and second substrates at the electrode side and the first pattern side and for hermetically sealing a space between the first and second substrates at peripheral portions thereof.

2. The organic electroluminescence device according to claim 1 wherein said sealing means comprises metallic junction portions formed on the peripheral portions on the first and second substrates, and joining the junction portions by soldering.

3. The organic electroluminescence device according to claim 1 further comprising driving circuits mounted on the second conductive pattern side of the second substrate for driving the organic electroluminescence device.

4. The organic electroluminescence device according to claim 1 wherein the cathode comprises a plurality of line electrodes, and the first conductive pattern comprises a plurality of line patterns corresponding to the line electrodes, and each pattern is electrically connected to the corresponding line electrode at both ends thereof.

5. The organic electroluminescence device according to claim 2 wherein the junction portion is formed into an annular wall.

* * * * *